Figure 1:
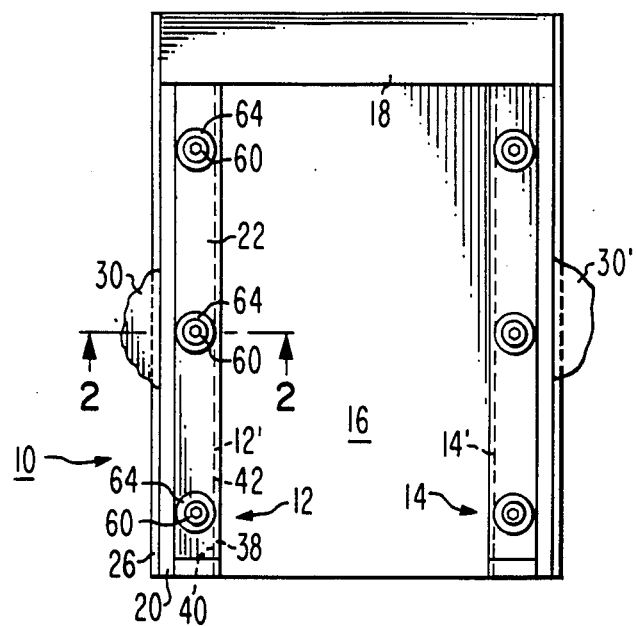

United States Patent [19]

Hirschhorn et al.

[11] Patent Number: 4,730,819
[45] Date of Patent: Mar. 15, 1988

[54] PRINTED CIRCUIT BOARD CLAMP FIXTURE

[75] Inventors: Marc P. Hirschhorn, Bensalem, Pa.; James H. Magown, Stratford, N.J.

[73] Assignee: The United States of America as represented by the Secretary of the Navy, Washington, D.C.

[21] Appl. No.: 869,296

[22] Filed: Jun. 2, 1986

[51] Int. Cl.⁴ .................................................. B25B 1/06
[52] U.S. Cl. ..................................... 269/221; 269/903
[58] Field of Search ............... 269/221, 256, 296, 903, 269/203, 254 CS

[56] References Cited

U.S. PATENT DOCUMENTS

| | | | |
|---|---|---|---|
| 1,339,448 | 5/1920 | Forsman et al. | 269/221 |
| 1,837,425 | 12/1931 | Gastan | 269/221 |
| 2,015,247 | 9/1935 | Tindal | 269/221 |
| 3,930,644 | 1/1976 | Albert, Jr. | 269/118 |
| 4,126,304 | 11/1978 | Barck | 269/73 |
| 4,311,266 | 1/1982 | Kondo | 228/40 |
| 4,531,474 | 7/1985 | Inuta | 118/503 |

Primary Examiner—Frederick R. Schmidt
Assistant Examiner—Judy J. Hartman
Attorney, Agent, or Firm—K. W. Dobyns; S. Sheinbein

[57] ABSTRACT

First and second mirror image identical clamps clamp opposite edges of a printed circuit board along the length of those edges for holding the board during wave soldering of components to the board. Each clamp includes a support rail and a clamp rail wherein the support rail has a shoulder on which a portion of the clamp rail can abut. The clamp rail has a two walled groove which receives a corner of the board at an edge thereof for clamping that edge to the support rail. Screws couple the two rails and force them against the board edge.

4 Claims, 2 Drawing Figures

PRINTED CIRCUIT BOARD CLAMP FIXTURE

The invention described herein may be manufactured and used by or for the Government of the United States of America for Governmental purposes without the payment of any royalties thereon or therefor.

This invention relates to a printed circuit board clamp fixture employed in a wave soldering apparatus.

Multilayered fiberglass printed circuit boards are relatively large in size, for example 4"×8", and have a tendency to warp and twist when passed through the heat of a conventional wave soldering machine. The solder temperature is about 500° C. and such temperature tends to warp a printed circuit board of multilayer fiberglass.

A clamp fixture for a printed circuit board for minimizing the warping of a printed circuit board during wave soldering comprises first and second parallel mirror image elongated clamps for clamping a printed circuit board therebetween. Each clamp comprises a support rail and a facing mating clamp rail having facing planar clamp surfaces. The clamp surfaces are adapted to receive substantially the entire edge of a printed circuit board therebetween to clamp against opposite respective corresponding broad face surfaces of the board at the edge. One of the rails includes a locating surface lying in a plane normal to and adjacent to the plane of one of the clamp surfaces for abutting and clamping to an edge surface of the board terminating at and located between the opposite broad face surfaces. Clamp tightening means are coupled to the rails for urging the rails in a direction to clamp the board edge therebetween.

Figure 2:
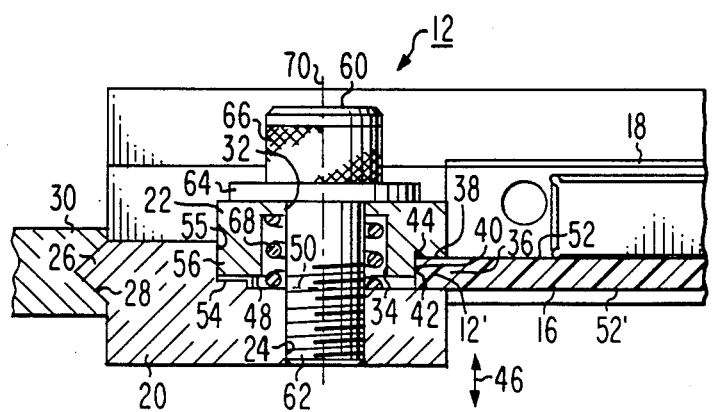

In the drawing:

FIG. 1 is plane view of a printed circuit board clamp fixture according to one embodiment of the present invention; and FIG. 2 is an elevation section view of the embodiment of FIG. 1 taken along lines 2—2.

In FIG. 1 clamp fixture 10 comprises a pair of mirror image identical printed circuit board clamps 12 and 14 for clamping respective opposite parallel edges 12' and 14' of a planar multilayer fiberglass printed circuit board 16. Printed circuit board 16 has attached thereto a connector 18 which is not coupled to the clamps 12 and 14.

Referring now to FIG. 2, clamp 12 comprises a lower support rail 20 and an upper clamping rail 22 over the support rail. Support rail 20 comprises an elongated integral member having a plurality of spaced threaded apertures 24 aligned in a linear array along the length thereof. Three apertures 24 are illustrated in this embodiment but more or fewer may be used. Projecting from a side of rail 20 is an elongated triangular ridge 26 which extends the length of the rail 20 and mates with an elongated triangular groove 28 in a support fixture (not shown) member 30 which is adapted to be adjustably secured to a conveyor in a wave soldering machine. Fixture 30 has a counterpart member 30' opposite and spaced from member 30 which forms a rectangular opening which is adjustable in a direction from left to right across the drawing figure.

Clamp rail 22 has a like plurality of apertures 32 corresponding to, and aligned with, respective ones of threaded apertures 24 in support rail 20. Each aperture 32 has a corresponding enlarged diameter recess 34 facing surface 50 of rail 20. Upper clamp rail 22 has groove 36 defined by a planar shoulder 38 which extends for the length of rail 22 parallel to surface 50 for substantially the entire length of the printed circuit board edge 12' and a second surface 42 extending for the same length perpendicular to clamping surface 38. The region at the intersection of the planes of surfaces 38 and 42 is undercut with a groove 44 to allow for a nonplanar bumps at the corner of the edge 12' of board 16. Surface 42 has a dimension in the directions 46 normal to surface 50 smaller than the thickness of the board 16 which extends in the same directions so that the bottom surface 48 of rail 22 sits above clamping surface 50 of support rail 20 when surface 38 abuts surface 52 of board 16 at edge 12' in groove 36.

Support rail 20 has a raised shoulder 54 relative to surface 50. Shoulder 54 is coplanar and extends for the length of the rail 20 normal to the drawing plane for the same extent as surfaces 38 and 42. The plane of shoulder 54 lies in the space between the planes of surfaces 50 and 38. Plane wall 55 is adjacent and normal to shoulder 54. The shoulder 54 is a heel for receiving in abutting relationship region 56 of clamp rail lower surface 48 when rail 22 is clamped against printed circuit board 16 and support rail 20. Wall 55 locks the rail 22 between support rail 20 and board 16.

Knurled screw 60 shaft 62 is screwed to aperture 24. Washer 64 is between the screw 60 head 66 and the threaded shaft 62. A compression spring 68, concentric with shaft 62 on axis 70.

In operation, printed circuit board 16 is slid into the fixture, normal to the drawing FIG. 2, into the groove formed by surfaces 38 and 40 of the clamp rail 22 and the portion of surface 50 of the support rail 20 juxtaposed with surface 38. Board 16 is also slid in a similar groove in clamp 14, FIG. 1, at the board 16 opposite edge 14'. The depth dimension of the slot formed by surfaces 38, 42 and 50 in a direction from right to left of FIG. 2, is, in one implementation, about ⅛th of an inch. Surface 42 clamps securely against the board edge 12' surface 40 while surfaces 38 and 50 clamp against the opposite board face surfaces 52 and 52', respectively, of board 16. Screw 60 is tightened to firmly clamp the printed circuit board edge 12' between surfaces 38 and 50. Rail 22 is oriented so that surface 42 abuts the entire length of edge 12'.

In FIG. 1, printed circuit board edge 14' is similarly attached to clamp 14. All screws 60 of clamps 12 and 14 move the upper clamp rails 22 toward the support rails 20 forcing surfaces 48 of the clamp rails 22 to abut shoulders 54 of the support rails 20. While a gap is shown between surface 48 and shoulder 54, such a gap need not be present, and, in this case, these surfaces abut. Shoulder 54 precludes rail 22 from tilting and thus binding during the clamping action. Of course, the equivalent to shoulder 54 can be provided on rail 22. Triangular groove 28 receives triangular ridge 26 of the support rail 20 for capturing the fixture comprising clamp 12 at one side of the adjustable support member 30. A similar ridge on clamp 14 is captured by a similar groove in the second member 30' identical to and facing member 30. Those two members form a central rectangular opening in which board 16 and clamps 12 and 14 are located. Those two members are squeezed together to clamp (by means not shown) clamps 12 and 14 and board 16 therebetween in directions normal to direction 46.

By clamping the board 16 along substantially its entire length at the opposite edges 12' and 14', FIG. 1, and clamping the clamps 12 and 14 to the supporting fixture securing members, such as members 30 and 30', board 16 is securely held in place and its tendency to warp minimized during exposure to the elevated temperatures of the solder bath (not shown).

What is claimed is:

1. A clamp fixture for minimizing warping of a printed circuit board during wave soldering comprising:

first and second parallel mirror image elongated clamps for clamping a printed circuit board therebetween;

each clamp comprising a support rail and a facing mating clamp rail having facing planar clamp surfaces, said clamp surfaces being adapted to receive substantially a corresponding edge area of the printed circuit board therebetween to clamp against opposite respective corresponding broad face surfaces of the board at said edge areas;

said clamp rail including a locating surface lying in a plane normal to and adjacent to a plane of one of said clamp surfaces for abutting and clamping to an edge surface of the board terminating at and located between said opposite broad face surfaces; and clamp tightening means coupled to the rails for urging the rails in a direction to clamp said board edge therebetween and a means for locking said clamp rail between said support rail and said printed circuit board edge area.

2. The fixture of claim 1 wherein an undercut recess is formed in said clamp rail along the region adjacent the intersection of the planes of the clamp rail surface and said locating surface to allow for nonplanar bumps at the corners of the board edge.

3. The fixture of claim 2 wherein said tightening means includes threaded fastening means coupling the support rail to the clamp rail and spring means for urging the rails in opposite directions.

4. The fixture of claim 3 wherein said locking means includes a stepped shoulder on said support rail having a surface perpendicular to the planes of said planar clamp surfaces for abutting a rear portion of said clamp rail.

* * * * *